Nov. 25, 1969 A. B. TANOS 3,480,473

METHOD OF PRODUCING POLYCRYSTALLINE PHOTOVOLTAIC CELLS

Filed June 24, 1966

INVENTOR.
ANDREW B. TANOS

BY

*Meyer, Tilberry & Body*

ATTORNEYS

United States Patent Office 3,480,473

Patented Nov. 25, 1969

3,480,473
METHOD OF PRODUCING POLYCRYSTALLINE PHOTOVOLTAIC CELLS

Andrew B. Tanos, Cleveland, Ohio, assignor to Kewanee Oil Company, Bryn Mawr, Pa., a corporation of Delaware Filed June 24, 1966, Ser. No. 560,141
Int. Cl. C23b *5/50*; H01m *15/04*
U.S. Cl. 117—217 8 Claims

ABSTRACT OF THE DISCLOSURE

This invention comprises a method of producing an improved polycrystalline photovoltaic cell, preferably of polycrystalline cadmium sulfide, by etching the surface of the polycrystalline semi-conductive material such as cadmium sulfide with hydrochloric acid, or preferably sulfuric acid, before the barrier is formed thereon. Photovoltaic cells made by the process of this invention have an output efficiency 30–50 percent higher than efficiencies of the same cells in which the etching step is omitted.

The present invention pertains to the art of manufacturing photovoltaic cells, and more particularly to a method of producing polycrystalline photovoltaic cells.

The invention is particularly applicable to the production of a photovoltaic cell comprising a film of polycrystalline cadmium sulfide, and it will be described with particular reference thereto; however, it is believed that this method may also be adapted for use with other polycrystalline photovoltaic films, such as cadmium telluride.

In recent years, it has become somewhat common practice to produce photovoltaic cells by vacuum evaporation of a polycrystalline cadmium sulfide film onto a substrate, such as glass or molybdenum. A barrier is formed by deposition of a metal, such as copper, onto the cadmium sulfide, or is formed in the top surface of the cadmium sulfide by immersion into a solution containing the metal ions, and electrodes are then attached to the barrier and the substrate. The solar energy conversion efficiency of these cells, hereinafter referred to as conversion efficiency which is basically the output power per unit area of the cell for a given solar radiation level, is one criteria by which the quality of these photovoltaic cells are measured. Since the conversion efficiency of most polycrystalline cadmium sulfide cells is below 10%, extensive work is being done to increase, even slightly, the conversion efficiency of these photovoltaic cells. The present invention relates to a method of increasing the conversion efficiency of a polycrystalline film, photovoltaic cell without substantially increasing the cost of producing the cell.

In accordance with the present invention, there is provided a method of producing a photovoltaic cell including, at least, a layer or film of polycrystalline semiconductive material with a barrier layer in intimate contact with the material. This method comprises etching the surface of the polycrystalline material with an acid selected from the class consisting of hydrochloric acid and sulfuric acid, before the barrier is formed in contact with the polycrystalline material.

As will be hereinafter discussed in detail, the acid etching by hydrochloric or sulfuric acid of the film surface, before the barrier is applied, substantially increases the output level of the polycrystalline, photovoltaic cell when subjected to a given solar radiation. Indeed, polycrystalline, thin film, photovoltaic cells processed in accordance with the present invention have been found to have an efficiency between 30%–50% higher than efficiencies of the same cells without being processed in accordance with the present invention.

The primary object of the present invention is the provision of a method of producing a polycrystalline, thin film photovoltaic cell having a conversion efficiency substantially greater than the efficiencies heretofore possible with these cells.

Another object of the present invention is the provision of a method of producing a polycrystalline, thin film, photovoltaic cell, which method includes etching the polycrystalline film with sulfuric or hydrochloric acid before forming the barrier layer over or in the film.

These and other objects and advantages will become apparent from the following description used to illustrate various aspects of the present invention as read in connection with the accompanying drawing in which.

Figure 1:
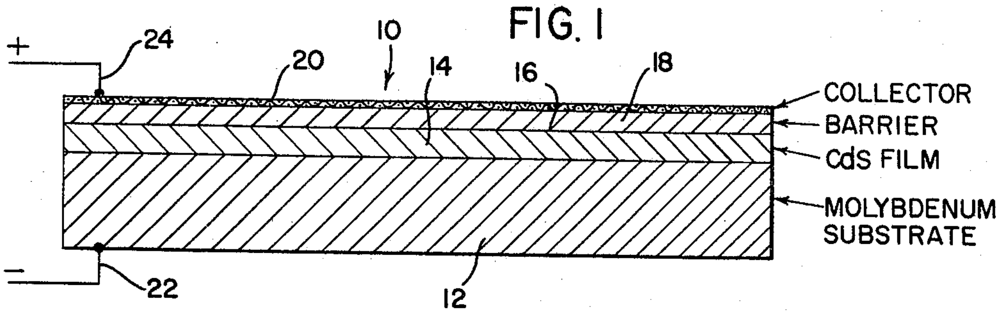
FIGURE 1 is a cross-sectional view illustrating, somewhat schematically, a polycrystalline, thin film, photovoltaic cell of the type to which the present invention is particularly adapted.

Referring now to the drawing, wherein the showings are for the purpose of illustrating certain aspects of the invention only and not for the purpose of limiting same, FIGURE 1 shows a polycrystalline, thin film photovoltaic cell 10 of the general type disclosed in United States Letters Patent No. 3,186,874 issued on June 1, 1965 to Daniel A. Gorski. For the purpose of explaining the present invention, the cell 10 is shown as a sandwiched composite structure including a support base or substrate 12 formed from a thin sheet of molybdenum. By vacuum deposition, a polycrystalline film 14 of N-type cadmium sulfide is formed onto one surface of the substrate 12. Opposite the substrate, the polycrystalline film 14 terminates in, and includes, a surface 16 at which a barrier 18 is subsequently formed from copper, or a similar metal. This barrier has a thickness of only a few microns. The barrier 18 may be formed at surface 16 by electrodeposition of copper from an acidic or basic plating solution onto the surface or by subjecting the film surface 16 to a solution of copper chloride. The latter chemical process is preferred. Whichever process is used, a relatively thin barrier 18 is provided on or in the surface 16 of the polycrystalline film 14. The barrier is made P-type by an exchange reaction with the N-type cadmium sulfide layer or film. To complete the photovoltaic cell, an electrode or collector 20 is secured onto barrier 18. This electrode may take a variety of forms; however, in practice, the electrode is an ohmic contact formed from a fine mesh wire of gold. Electrical leads 22, 24 are then secured onto the substrate 12, and electrode 20, respectively, to provide output leads for the cell 10. As so far described, the cell 10 does not differ substantially from the cells now being used commercially.

In accordance with the present invention, the surface 16 of the polycrystalline film 14 is etched with sulfuric or hydrochloric acid before formation of the barrier 18.

When using sulfuric acid ($H_2SO_4$), it is preferable that chemically concentrated sulfuric acid be used. This concentrated acid is bought in glass containers, and it is believed to be at least 90% by weight sulfuric acid and probably at least 98% by weight sulfuric acid. Although it would appear that hot sulfuric acid would be better adapted for etching the cadmium sulfide surface 16, in practice of the invention the sulfuric acid is used at room temperature. If the acid is heated, the etching time is decreased. When this decrease brings the time down to a short period, less accurate control may be maintained. The etching process has been continued for various periods between approximately 5 seconds and substantially over 1 minute at room temperature. By observation and subsequent testing, which will be described, it was found that the surface 16 should be maintained in contact with the room temperature sulfuric acid for at least 25 seconds. The efficiency of the cell 10 was increased steadily from about 5 seconds to 50–60 seconds. After that, the efficiency was not increased in proportion to the etching time. The optimum etching time was found to be approximately 50 seconds. After one minute, no further benefit was accomplished, apparently because the etching action includes the following two dominant etching processes:

$$H_2SO_4 + CdS \rightarrow CdSO_4 + H_2S$$

$$2H_2SO_4 + SdS \rightarrow CdSO_4 + 2H_2O + SO_2 + (S)$$

From the above etching formulas, it is seen that sulfur (S) is released by the etching process. Apparently, this sulfur, since it is not soluble in sulfuric acid, inhibits the etching process after one minute or so of etching.

When hydrochloric acid (HCl) was used to etch the surface 16 of cadmium sulfide film 14, it was noted that the hydrochloric acid reacted somewhat violently with the film. After extensive testing, it was found that the hydrochloric acid would produce more uniform and controllable improved efficiency results if the acid were diluted by a ratio of approximately 1:1. With this volume ratio, it was found that hydrochloric acid should not be left in contact with the film surface 16 for more than approximately 30 seconds. After that time, distinct short circuits appear between surface 16 and the substrate 12. The dominant etching process of HCl appears to be the following:

$$2HCl + CdS \rightarrow CdCl_2 + H_2S$$

This process does not release free sulfur (S) as does the sulfuric acid. Therefore, there is no inhibiting factor or substance to slow down the etching process. This aspect also accounts for the superior results obtained with sulfuric acid, in a manner to be explained later. Hydrochloric acid has proven to be less effective in increasing the overall efficiency of the photovoltaic cell 10 than sulfuric acid. In other words, sulfuric acid is preferable and hydrochloric acid is usable. This will be developed later in this discussion.

The tests to be explained in detail have proven that the overall efficiency of cell 10 is improved only by using hydrochloric and sulfuric acid. The specific and detailed tests conducted upon nitric acid and acetic acid have proven these acids to be unsuccessful in increasing the efficiency of cell 10.

The etching processes as explained above have increased the solar conversion efficiency of cell 10 to as much as 5.85% which is an increase of 30%–50% over prior cell efficiencies. This is a substantial increase in efficiency, which substantially enhances the quality of the photovoltaic cell 10.

Although the exact reasons for the increased efficiency when etching surface 16 with hydrochloric or sulfuric acid and the reason why sulfuric acid performs better than hydrochloric acid is not precisely known, certain theories are believed to be material in this result.

When the crystals of cadmium sulfide film 14 are formed, they tend to drive to the outer surface a certain amount of impurities which cannot be accommodated by lattice structure of the crystals. These impurities are apparently removed when the surface 16 is etched. By removing these impurities, before the barrier 18 is chemically formed at the surface 16, the impurities on the surface do not migrate into the barrier layer when it is forming into a P-type material. It is known that relatively minute quantities of impurities in the barrier layer can drastically change the properties of the barrier layer. The barrier layer when formed is quite thin, and even small amounts of undesired impurities from the cadmium sulfide film have pronounced detrimental results. Consequently, one attribute of the etching process is the apparent removal by the acid of various surface impurities on the polycrystalline film so that the film is left chemically clean for subsequent formation of a uniform barrier layer. This aspect is apparently carried out with equal facilities by hydrochloric acid and sulfuric acid. It has been found that the etched surface 16 may be processed further without removing the acid by a subsequent rinse.

In the case of sulfuric acid, the etching of the surface 16 removed cadmium from the crystals exposed at this surface. This leaves a sulfur rich crystal for formation of the barrier which has proven to be substantially greater in photovoltaic output than a cadmium rich crystal. In other words, the cadminum sulfide crystal lattice is so constructed that the bonding forces between the atomic layers are arranged in a manner that the gradual breakdown of the lattice by the acid etch will always reveal a sulfur-rich surface on one face of the crystal and cadmium rich surface on the other face of the crystal. These faces are perpendicular to the optical axis of the crystal. It has been noted that barriers formed onto the sulfur-rich surfaces yield approximately twice the photovoltaic output as barriers formed on the cadmium rich surface of the crystals. The reason for this phenomena is not yet understood; however, it is a fact that the cadmium sulfide surface 16 should be enriched in sulfur before the barrier layer 18 is formed thereon or therewith.

The enriching of the crystalline surface by increasing the sulfur-to-cadmium ratio on the surface should not be confused with the deposition of molecular sulfur ($S_8$). This sulfur would have a detrimental effect when the copper chloride is used to form the barrier 18 at film surface 16. The crystal itself has a high sulfur-to-cadmium ratio. Hydrochloric acid apparently does not produce this high sulfur-to-cadmium ratio on the etched surface. Sulfuric acid does accomplish this purpose. The previous formulas mentioned with regard to the sulfuric acid etching process illustrates that sulfur (S) is left after the etching process. The cadmium is formed into cadmium sulfate ($SdSO_4$). The increase in the sulfur-to-cadmium ratio at the crystal surface apparently explained why the sulfuric acid has little effect after approximately one minute of etching. The high sulfur ratio in the crystals themselves at the exposed, or etched, surface prevents or inhibits further etching action by the sulfuric acid. Since sulfuric acid has this preferred etching function, it appears to be better than the hydrochloric acid for use in the present invention.

Figure 2A:
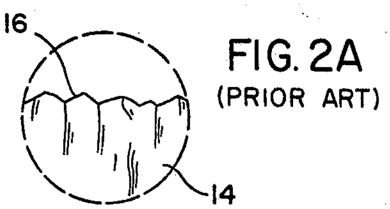
FIGURE 2A is a magnified, partial view illustrating schematically the exposed surface of the prior art polycrystalline film.
Figure 2B:
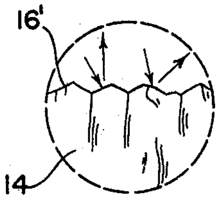
FIG. 2B (PRIOR ART)
FIGURE 2B is a magnified, partial schematic view illustrating an operating principle of the prior art film surface shown in FIGURE 2A.
Figure 3A:
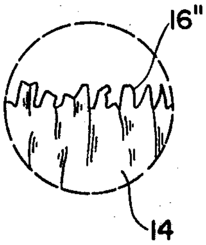
FIGURE 3A is a magnified, partial view illustrating the exposed surface of a thin polycrystalline film processed in accordance with the present invention.
Figure 3B:
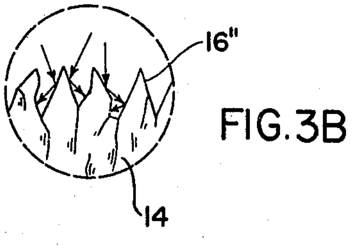
FIGURE 3B is a magnified, partial schematic view illustrating at least one operating characteristic of the film surface illustrated in FIGURE 3A; and, FIGURE 4 is a chart representing the current densities of certain test samples processed in accordance with the invention and compared with control samples not processed in accordance with the present invention.

Referring now to FIGURES 2A, 2B, 3A, and 3B, a further explanation for the increased efficiency of cells processed in accordance with the present invention is illustrated. In the prior art, as shown in FIGURES 2A, 2B, the unetched surface 16' is relatively flat Consequent-. ly, radiation rays striking the surface will tend to be reflected without being absorbed into the cadmium sulfide to perform the photovoltaic function. Referring now to the surface 16" which is etched in accordance with the present invention, as shown schematically in FIGURE 3A. This etched surface 16" provides upwardly extending needles having an orientation near perpendicular to the substrate. These needles perform two apparent functions which enhance the efficiency developed by the cell. First, as shown in FIGURE 3B, light rays striking the needles of surface 16" are diffused and absorbed by the surface. Consequently, more radiation is absorbed by the etched surface 16" than by the unetched surface 16' shown in FIGURES 2A and 2B. In addition, by providing the upstanding needles as shown in FIGURE 3A, there is a substantial increase in the surface contact between the barrier layer 18 and the etched surface 16". This increased surface area provides a larger area for barrier formation which enhances the operation of cell 10. These features somewhat explain why a cell constructed in accordance with the present invention has an increased efficiency. This aspect of the invention appears to be accomplished by both hydrochloric and sulfuric acid.

Apparently the provision of a highly light absorbing surface as shown in FIGURES 3A, 3B is the primary reason why hydrochloric acid increases the efficiency of the polycrystalline cell 10. Hydrochloric acid also performs the purifying function as previously explained; however, this acid does not perform the preferential etching of the crystals to provide a sulfur enriched crystal at the exposed surface 16". This last feature is somewhat unique with the sulfuric acid etching process for the reason previously explained.

The present invention has been described in somewhat general terms. To more clearly understand the present invention and some of its benefits, certain laboratory preformed tests are hereinafter set out in detail. These tests are representative in nature, and it should be appreciated that various other tests have been performed to substantiate the statements made in the above description of the present invention.

TEST SAMPLES A

Figure 4:
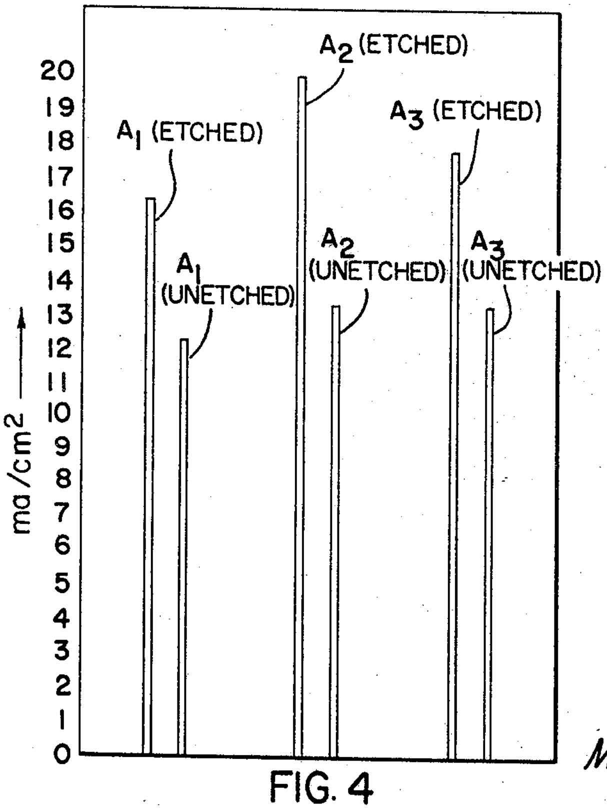

The chart shown in FIGURE 4 represents the results of tests conducted on three separate samples $A_1$, $A_2$ and $A_3$. Each of these samples was prepared by vacuum evaporation of a polycrystalline film of cadmium sulfide onto a molybdenum substrate, in accordance with general production procedures. Each sample was then divided into at least two separate units.

The first, or control, unit of each sample was further processed in accordance with normal production procedures with the barrier being formed on the polycrystalline film by subjecting the film to a copper chloride solution. Thereafter a completed photovoltaic cell was formed from these first, control units.

In accordance with the invention, the surface of the cadmium sulfide film on a second unit of each sample was subjected to chemically concentrated sulfuric acid (at least over 70% by weight sulfuric acid) at room temperature for approximatey 50 seconds. Then these second units were rinsed with distilled water, and formed into photovoltaic cells in accordance with normal procedures.

The first, or control, cell and the second cell were tested by standard procedures to determine their output characteristics. For the purpose of this discussion, only the general testing process need be explained. The cells were each subjected to a floodlight which was adjusted to approximate the effect of exposing a cell to 100 mw./cm.$^2$ of actual sunlight. While so exposed, the open circuit voltages and the short circuit currents of the cells were measured. The voltage values were all within the approximate range of .40–.45 volts, the general range of an operable photovoltaic cell. The current readings, which are indicative of the output power of the cells, were then observed and divided by the area of the units, i.e. approximately 36 cm.$^2$. This provided a current density value for each sample unit or cell, and these current densities are recorded on the chart in FIGURE 4. The current densities of the units processed in accordance with the present invention are labeled "etched," and the current densities of the corresponding control units are labeled "unetched."

Sample $A_1$, exhibited an increase from 12.2 ma./cm.$^2$ to 16.4 ma./cm.$^2$, or approximately 35%. In a like manner, the short circuit current density of sample $A_2$ increased approximately 50%, and the short current density of sample $A_3$ increased approximately 36%. From samples A, it is seen that the etching of the surface of the polycrystalline cadmium sulfide film produces a distinct increase in the current density with the same input power from a light source.

TEST SAMPLES B

A single standard production sample, including a polycrystalline cadmium sulfide film vacuum evaporated onto a molybdenum substrate, was subdivided into nine separate cell units, each including approximately 4 cm.$^2$ of film area. Three of the sample units were processed in accordance with standard procedures. The copper barriers were formed on these units, and the electrodes were attached. These sample units were then subjected to the standard light test with the following results:

| Unit | Short circuit current, ma. | Open circuit voltage |
|---|---|---|
| $B_1$ | 48 | .38 |
| $B_2$ | 48 | .42 |
| $B_3$ | 40 | .42 |
| Average | 46 | |

The next three sample units were etched with a 1:1 solution by volume of hydrochloric acid (HCl) for approximately 5 seconds. The units were then rinsed with distilled water. Thereafter, the copper barrier was deposited on the polycrystalline film, and the electrodes were attached, in accordance with normal procedures. These sample units when tested by the standard light test, produced the following results:

| Unit | Short circuit current, ma. | Open circuit voltage |
|---|---|---|
| $B_4$ | 54 | .41 |
| $B_5$ | 50 | .41 |
| $B_6$ | 46 | .42 |
| Average | 50 | |

It is clear, when comparing the test results for units $B_1$, $B_2$ and $B_3$ with the test results of units $B_4$, $B_5$ and $B_6$, that sample units processed by etching with hydrochloric acid were found to have an average current increase of 4 ma. or 11% over the control units.

The next three sample units were then subjected to a concentrated solution of sulfuric acid for approximately 15 seconds. "Concentrated" indicates the commercially available acid which is known to be diluted less than 5% and probably less than 2%. After this etching process was performed, the units were rinsed and processed into cells. These cells were then tested by the standard light test with the following results:

| Unit | Short circuit current, ma. | Open circuit voltage |
|---|---|---|
| $B_7$ | 60 | .42 |
| $B_8$ | 62 | .41 |
| $B_9$ | 62 | .42 |
| Average | 61 | |

By comparing the test results for units $B_1$, $B_2$, and $B_3$ with the test results for units $B_7$, $B_8$, and $B_9$, it is observed that the units etched with sulfuric acid exhibited an average current increase of 15 ma. or approximately 33% over the control units.

TEST SAMPLES C

The above test with samples B was repeated with a different production sample with the following results:

UNETCHED

| Unit | Short circuit current, ma. | Open circuit voltage |
|---|---|---|
| $C_1$ | 40 | .42 |
| $C_2$ | 35 | .45 |
| $C_3$ | 40 | .44 |
| Average | 38 | |

HCl ETCHED

| Unit | Short circuit current, ma. | Open circuit voltage |
|---|---|---|
| $C_4$ | 45 | .40 |
| $C_5$ | 58 | .40 |
| $C_6$ | 40 | .40 |
| Average | 48 | |

$H_2SO_4$ ETCHED

| Unit | Short circuit current, ma. | Open circuit voltage |
|---|---|---|
| $C_7$ | 52 | .42 |
| $C_8$ | 50 | .42 |
| $C_9$ | 54 | .40 |
| Average | 53 | |

The above results confirm the results observed with samples B; in fact, the units etched with hydrochloric acid exhibited approximately a 26% increase in the average current, and the units etched with sulfuric acid exhibited approximately a 40% increase in the average current. These results clearly show the advantages of etching the polycrystalline films with hydrochloric or sulfuric acid before the barrier is applied.

FURTHER TESTS

The etching process was attempted with nitric acid ($HNO_3$); however, after extensive tests, it was determined that this acid was not useful for increasing the output of a photovoltaic cell. When nitric acid was used, the etching action produced a precipitated sulfur on the surface which apparently caused a defective barrier junction. The surface reflection was not decreased significantly. This condition was not changed by varying the time, temperature or concentration of the nitric acid. Consequently, it is believed that nitric acid will not perform in the present invention.

In a like manner acetic acid ($CH_3COOH$) was used to etch the surface of the polycrystalline cadmium sulfide film prior to formation of the barrier. The acid solution was varied between concentrated and 5 parts distilled water to one part acetic acid, and the time was varied between .5 second and 5 minutes. However, no consistent results were obtained. The reason for this is not presently known.

The present invention has been described in connection with certain specific examples; however, it should be appreciated that various changes may be made in these examples without departing from the intended spirit and scope of the present invention as defined in the appended claims.

Having thus described my invention, I claim:

1. A method for producing a cadmium sulfide photovoltaic cell of improved efficiency comprising:

(1) forming a layer of polycrystalline cadmium sulfide;

(2) etching said cadmium sulfide layer with an acid selected from the group consisting of hydrochloric and sulfuric, the concentration of the hydrochloric acid being at least 1 volume concentrated hydrochloric acid to 1 volume of water, said sulfuric acid concentration being at least 70% by weight;

(3) depositing a metal barrier layer directly on the etched cadmium sulfide layer; and (4) attaching electrodes to both the cadmium sulfide layer and the metal barrier layer.

2. A method as defined in claim 1 wherein sulfuric acid is used as an etchant and the etching takes place for a period exceeding 25 seconds.

3. A method as defined in claim 1 wherein sulfuric acid is used as an etchant and the etching step is performed substantially at room temperature.

4. A method as stated in claim 1 wherein hydrochloric acid is used as the etchant and the etching takes place for a period of less than 30 seconds.

5. The method as defined in claim 1 wherein said metal barrier layer is copper.

6. The method as defined in claim 5 wherein said copper barrier layer is formed by subjecting said etched layer to a solution of copper chloride.

7. The method as defined in claim 5 wherein said copper barrier layer is electrodeposited on said etched cadmium sulfide layer.

8. A method of producing a polycrystalline cadmium sulfide photovoltaic cell of improved efficiency comprising:

(1) forming a layer of polycrystalline cadmium sulfide on a molybdenum substrate;

(2) etching said cadmium sulfide layer with concentrated sulfuric acid at approximately room temperature for a period exceeding approximately 25 seconds;

(3) chemically depositing a copper barrier layer directly on said etched cadmium sulfide layer, and (4) attaching electrodes in electrical contact with said cadmium sulfide layer and said copper barrier layer.

References Cited

UNITED STATES PATENTS

| | | | |
|---|---|---|---|
| 2,820,841 | 1/1958 | Carlson et al. | 317—237 X |
| 2,880,119 | 3/1959 | Floyd, Jr. | 117—201 |
| 3,186,874 | 6/1965 | Gorski | 317—237 X |
| 3,194,703 | 7/1965 | Bloem | 156—17 |
| 3,218,204 | 11/1965 | Ruehrwein. | |
| 3,222,215 | 12/1965 | Dürr | 117—201 |
| 3,374,108 | 3/1968 | Keramidas | 117—200 |

OTHER REFERENCES

W. J. Blaedel and V. W. Meloche, Elementary Quantitative Analysis, Row, Peterson and Company, Evanston, Ill., 1957, p. 781.

ALFRED L. LEAVITT, Primary Examiner

C. K. WEIFFENBACH, Assistant Examiner

U.S. Cl. X.R.

117—62, 106, 200, 227; 136—89